United States Patent
Park et al.

(10) Patent No.: US 11,903,148 B2
(45) Date of Patent: Feb. 13, 2024

(54) DISPLAY DEVICE

(71) Applicant: SAMSUNG DISPLAY CO., LTD., Yongin-si (KR)

(72) Inventors: Dong Jin Park, Seongnam-si (KR); Han Sun Ryou, Seoul (KR); Min Gu Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/170,778

(22) Filed: Feb. 17, 2023

(65) Prior Publication Data

US 2023/0209732 A1     Jun. 29, 2023

Related U.S. Application Data

(63) Continuation of application No. 17/214,514, filed on Mar. 26, 2021, now Pat. No. 11,589,465, which is a continuation of application No. 16/532,206, filed on Aug. 5, 2019, now Pat. No. 10,966,329.

(30) Foreign Application Priority Data

Aug. 21, 2018 (KR) .................. 10-2018-0097452

(51) Int. Cl.
- *H05K 5/00* (2006.01)
- *H10K 50/84* (2023.01)
- *H10K 59/12* (2023.01)
- *H10K 102/00* (2023.01)

(52) U.S. Cl.
CPC ........... *H05K 5/0017* (2013.01); *H10K 50/84* (2023.02); *H10K 59/12* (2023.02); *H10K 2102/311* (2023.02)

(58) Field of Classification Search
None
See application file for complete search history.

(56) References Cited

U.S. PATENT DOCUMENTS

| | | |
|---|---|---|
| 8,804,324 B2 | 8/2014 | Bohn et al. |
| 9,857,832 B2 | 1/2018 | Kim et al. |
| 9,983,424 B2 | 5/2018 | Kim et al. |
| 10,008,695 B2 | 6/2018 | Park et al. |
| 10,198,038 B2 | 2/2019 | Jang et al. |

(Continued)

FOREIGN PATENT DOCUMENTS

| | | |
|---|---|---|
| CN | 106875845 A | 6/2017 |
| CN | 107067975 A | 8/2017 |

(Continued)

OTHER PUBLICATIONS

Chinese Office action dated Jul. 7, 2022 issued in corresponding CN Application No. 201910767631.9, 10 pages.

*Primary Examiner* — Xanthia C Relford
*Assistant Examiner* — Xanthia C Cunningham
(74) *Attorney, Agent, or Firm* — Lewis Roca Rothgerber Christie LLP

(57) ABSTRACT

A display device includes: a panel assembly including a display panel; a bracket to which the panel assembly is attached; and a buffer layer between the panel assembly and the bracket, and the buffer layer includes: a first portion having a first elastic modulus; and a second portion surrounded by the first portion and having a second elastic modulus that is less than the first elastic modulus.

17 Claims, 9 Drawing Sheets

(56) References Cited

U.S. PATENT DOCUMENTS

| | | | |
|---|---|---|---|
| 2007/0097014 A1* | 5/2007 | Solomon | G06F 1/1616 |
| | | | 345/1.1 |
| 2012/0314399 A1* | 12/2012 | Bohn | H04M 1/0268 |
| | | | 361/679.01 |
| 2013/0307816 A1* | 11/2013 | Lee | G06F 1/1684 |
| | | | 345/173 |
| 2014/0118902 A1 | 5/2014 | Kim | |
| 2014/0226275 A1* | 8/2014 | Ko | G06F 1/1652 |
| | | | 361/679.27 |
| 2015/0035812 A1* | 2/2015 | Shin | G06F 1/1601 |
| | | | 345/204 |
| 2015/0147532 A1 | 5/2015 | Nam et al. | |
| 2018/0053451 A1 | 2/2018 | Han | |
| 2018/0164923 A1 | 6/2018 | Hirabayashi | |
| 2018/0181165 A1 | 6/2018 | Park et al. | |

FOREIGN PATENT DOCUMENTS

| | | |
|---|---|---|
| JP | 2010-181462 A | 8/2010 |
| KR | 10-2012-0067506 A | 6/2012 |
| KR | 10-2015-0018730 A | 2/2015 |
| KR | 10-2016-0144912 A | 12/2016 |
| KR | 10-2017-0063344 A | 6/2017 |
| KR | 10-2018-0021299 A | 3/2018 |
| WO | WO 2012/167204 A2 | 12/2012 |
| WO | WO 2015/126068 A1 | 8/2015 |
| WO | WO 2016/208857 A1 | 12/2016 |

\* cited by examiner

DISPLAY DEVICE

CROSS-REFERENCE TO RELATED APPLICATIONS

This application is a continuation of U.S. patent application Ser. No. 17/214,514, filed on Mar. 26, 2021, which is a continuation of U.S. patent application Ser. No. 16/532,206, filed on Aug. 5, 2019, now U.S. Pat. No. 10,966,329, which claims priority to and the benefit of Korean Patent Application No. 10-2018-0097452, filed on Aug. 21, 2018 in the Korean Intellectual Property Office, the entire contents of all of which are incorporated herein by reference.

BACKGROUND

1. Field

Aspects of embodiments of the present disclosure relate to a display device.

2. Description of the Related Art

A display device, such as an organic light emitting diode display and a liquid crystal display device, includes a display panel manufactured by forming a plurality of layers and elements on a substrate. Glass may be used for the substrate of the display panel. However, the glass substrate is heavy and fragile. In addition, it is difficult to deform the display panel because the glass substrate is generally rigid. In recent years, a flexible display panel using a flexible substrate that is light, strong against impact, and easy to deform, and a flexible display device including the flexible display panel, have been developed.

The flexible display device may be classified into a bendable display device, a foldable display device, a rollable display device, a stretchable display device, and the like, depending on its usage and form. A cover window may be attached on the flexible display panel to protect the flexible display panel. The window must also be flexible in order for the flexible display device to be bendable, foldable, rollable, or stretchable. However, the flexible window may be more vulnerable to impact than a rigid window.

The above information disclosed in this Background section is for enhancement of understanding of the background of the invention and, therefore, it may contain information that does not form the prior art that is already known in this country to a person of ordinary skill in the art.

SUMMARY

According to an aspect of exemplary embodiments, a display device has improved impact resistance. According to an aspect of one or more embodiments, the display device is a flexible display device.

A display device according to one or more exemplary embodiments includes: a panel assembly including a display panel; a bracket to which the panel assembly is attached; and a buffer layer between the panel assembly and the bracket, wherein the buffer layer includes: a first portion having a first elastic modulus; and a second portion surrounded by the first portion and having a second elastic modulus that is less than the first elastic modulus.

The first portion may be located along an edge of the panel assembly.

The panel assembly may include a display area to display an image, and a non-display area around the display area, and the first portion may overlap with the non-display area The second portion may overlap with the display area.

The first elastic modulus may be 1000 MPa or more, and the second elastic modulus may be 5 MPa or less.

The first portion may include a polymer or a metal.

The second portion may include a foam resin.

The buffer layer may further include a third portion surrounded by the second portion and having a third elastic modulus that is lower than the second elastic modulus.

The panel assembly may further include a cover window on the display panel, and at least a portion of the cover window may be flexible.

The panel assembly may further include an anti-reflective layer between the display panel and the cover window.

The panel assembly may further include a bottom chassis between the display panel and the buffer layer. The bottom chassis may be attached to the bracket by the buffer layer.

The panel assembly may further include a cushion layer between the display panel and the bottom chassis.

A display device according to one or more exemplary embodiments includes: a panel assembly including a display panel and a cover window on the display panel; a bracket below the panel assembly; and a buffer layer between the panel assembly and the bracket and including a first portion and a second portion, wherein the first portion has a rigidity that is greater than a rigidity of the second portion, the first portion being located further outward from a center of the panel assembly than the second portion.

The first portion may surround the second portion.

The first portion may have an elastic modulus that is 1000 MPa or more, and the second portion may have an elastic modulus that is 5 MPa or less.

The first portion may include a polymer or a metal.

The second portion may include a foam resin.

The buffer layer may further include a third portion having a rigidity that is less than the rigidity of the second portion, and may be closer to the center of the panel assembly than the second portion.

The panel assembly may further include a bottom chassis below the display panel, and the bottom chassis may be attached to the bracket by the buffer layer.

According to exemplary embodiments, a display device with improved impact resistance is provided.

DETAILED DESCRIPTION

Figure 1:
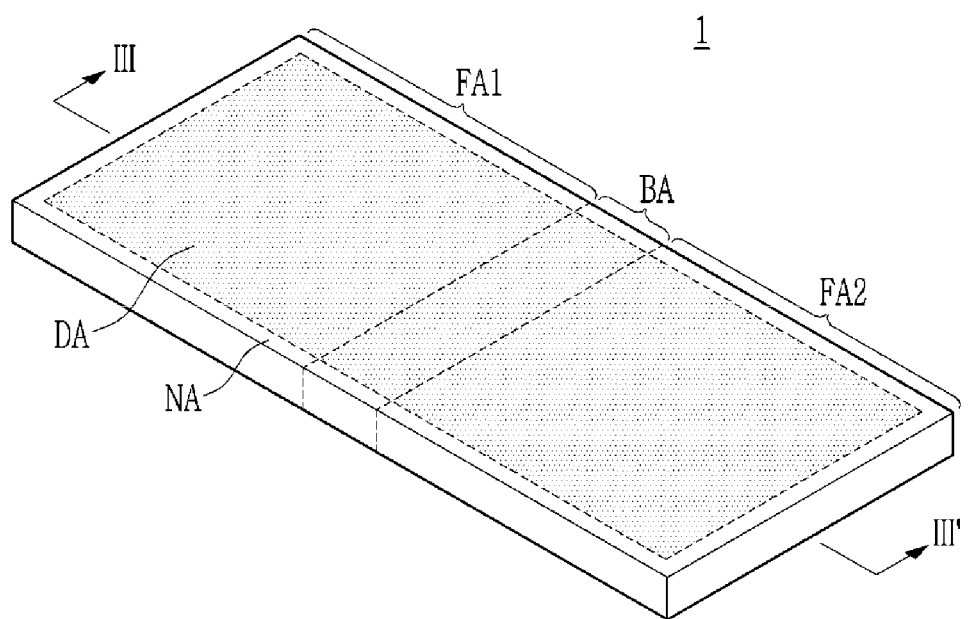
FIG. 1 illustrates a schematic perspective view of a display device according to an exemplary embodiment.

The present invention will be described more fully hereinafter with reference to the accompanying drawings, in which some exemplary embodiments of the invention are shown. As those skilled in the art would realize, the described embodiments may be modified in various different ways, all without departing from the spirit or scope of the present invention.

To clearly describe the present invention, parts that are irrelevant to the description may be omitted, and like numerals refer to like or similar constituent elements throughout the specification.

Further, since sizes and thicknesses of constituent members shown in the accompanying drawings may be arbitrarily given for better understanding and ease of description, the present invention is not limited to the illustrated sizes and thicknesses. In the drawings, the thicknesses of layers, films, panels, regions, etc., may be exaggerated for clarity. In the drawings, for better understanding and ease of description, the thicknesses of some layers and areas may be exaggerated.

It is to be understood that when an element, such as a layer, film, region, or substrate, is referred to as being "on" another element, it may be directly on the other element or one or more intervening elements may also be present. In contrast, when an element is referred to as being "directly on" another element, there are no intervening elements present.

In addition, unless explicitly described to the contrary, the word "comprise" and variations such as "comprises" or "comprising" are to be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

A display device according to an exemplary embodiment of the present invention will now be described in further detail with reference to the accompanying drawings. Although an organic light emitting diode display is used as an example of a display device, the present invention is not limited to an organic light emitting diode display, and may be applied to other display devices, such as a liquid crystal display.

Figure 2:
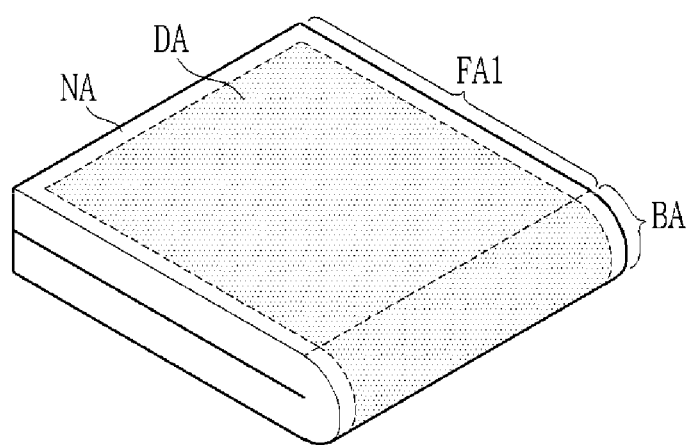
FIG. 2 is a perspective view schematically illustrating a folded state of the display device shown in FIG. 1.

FIG. 1 illustrates a schematic perspective view of a display device 1 according to an exemplary embodiment; and FIG. 2 is a perspective view schematically illustrating a folded state of the display device 1 shown in FIG. 1.

The display device 1 may be flatly unfolded as illustrated in FIG. 1, and may be folded as illustrated in FIG. 2. In an embodiment, the display device 1 includes a bending area BA, and a first flat area FA1 and a second flat area FA2 disposed at opposite sides of the bending area BA. The bending area BA is a region which is bent when the display device 1 is folded, and the first flat area FA1 and the second flat area FA2 are regions which are not substantially bent. Although one bending area BA is illustrated, the display device 1 may include a plurality of bending areas BA spaced from each other or may be bent at different curvature radii.

The display device 1 includes a display area DA for displaying an image, and a non-display area NA which surrounds the display area DA. The display area DA may correspond to a screen, and the non-display area NA may correspond to a bezel. Although the display device 1 and the display area DA are shown with four corners that are formed angularly, the corners may be rounded. The display device 1 may be folded such that the screen may be exposed to the outside as illustrated in FIG. 2. Alternatively, the display device 1 may be folded such that the screen is not visible (e.g., a screen of the first flat area FA1 faces a screen of the second flat area FA2).

Figure 3:
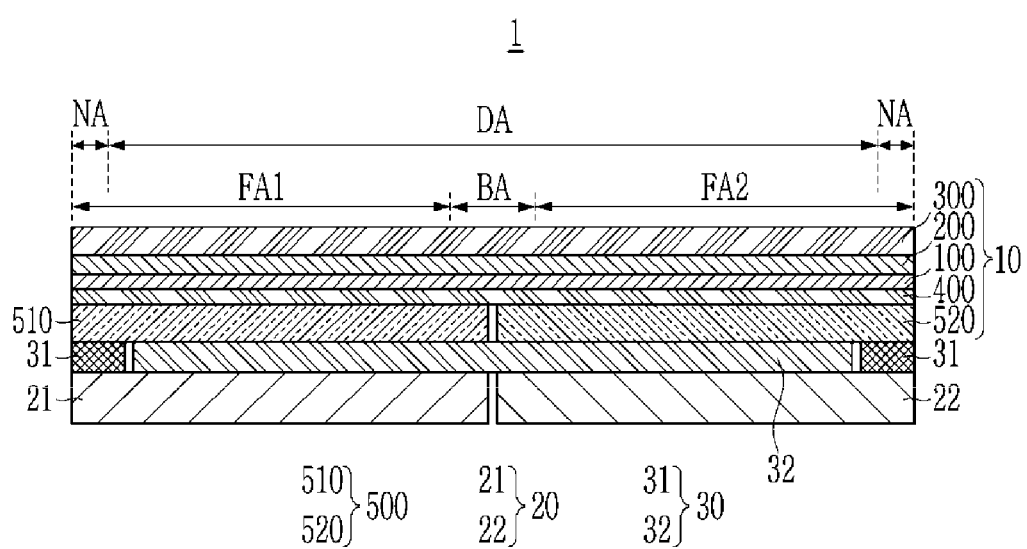
FIG. 3 is a cross-sectional view taken along the line III-III' of FIG. 1, according to an exemplary embodiment.
Figure 4:
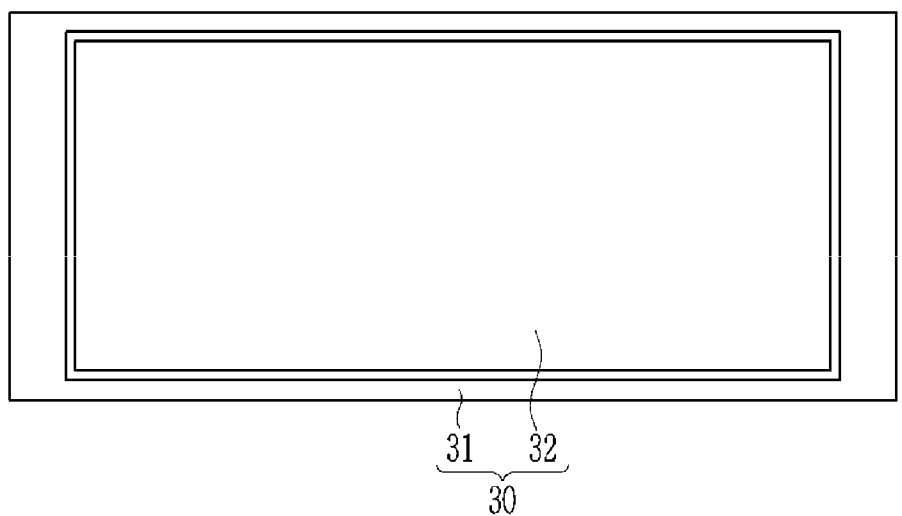
FIG. 4 is a bottom view illustrating the display device illustrated in FIG. 3 from which a bracket is omitted.

FIG. 3 is a cross-sectional view taken along the line III-III' of FIG. 1, according to an exemplary embodiment; and FIG. 4 is a bottom view illustrating the display device illustrated in FIG. 3 from which a bracket 20 is omitted.

Referring to FIG. 3 and FIG. 4, the display device 1 has a structure in which various constituent elements are stacked. In an embodiment, the display device 1 includes a panel assembly 10 including a display panel 100, an anti-reflective layer 200 and a cover window 300 disposed above the display panel 100, and a cushion layer 400 and a bottom chassis 500 disposed below the display panel 100. The display device 1 also includes a buffer layer 30 and the bracket 20 disposed below the panel assembly 10. Similar to the display device 1, the panel assembly 10 and the display pane 100 include a display area DA and a non-display area NA, and also include a bending area BA and flat areas FA1 and FA2.

The display pane 100 is a panel in which pixels capable of displaying an image are formed on a substrate. The display pane 100 may include light emitting diodes (LEDs) corresponding to the pixels. The display pane 100 is a flexible panel having at least a portion that is bendable. For example, the display pane 100 may be flexible and bendable in at least a region corresponding to the bending area BA of the display device 1, or may be entirely flexible. In an embodiment, the display pane 100 may include a touch sensor layer capable of sensing a touch.

The anti-reflective layer 200 is disposed on the display panel 100. The anti-reflective layer 200 may include a polarization layer for reducing external light reflection. The anti-reflective layer 200 may be attached to the display pane 100 or formed on the display panel 100.

The cover window 300 is disposed on the anti-reflective layer 200. The cover window 300 is an optically transparent layer having a surface that is exposed to the outside of the display device 1. The cover window 300 may serve to protect the underlying constituent elements, particularly the display panel 100.

The cover window 300 is a flexible window having at least a portion that is bendable. For example, the cover window 300 may be flexible and bendable in at least a region corresponding to the bending area BA of the display device 1, or may be entirely flexible. In an embodiment, the cover window 300 may be a polymer film made of a polymer, such as polyimide (PI), polyethylene terephthalate (PET), or polyurethane (PU) to have a flexible characteristic. In an embodiment, the cover window 300 may be a glass film in which a region corresponding to the bending area BA of the display device 1 is formed locally thin (e.g., less than 100 μm in thickness). Such a flexible window may be more vulnerable than a rigid window (e.g., a glass plate having a thickness of about 100 μm or more) in protecting the display pane 100 from an external impact. The cover window 300 may be attached to the anti-reflective layer 200 by an adhesive, such as an optically clear adhesive (OCA) or a pressure sensitive adhesive (PSA).

The cushion layer 400 is disposed below the display panel 100. The cushion layer 400 may absorb an impact to protect the panel assembly 10, particularly the display panel 100. The cushion layer 400 may be a porous layer made of, for example, a foam resin. In an embodiment, the cushion layer 400 may be attached to the display pane 100 in the form of a cushion tape.

The bottom chassis 500 is disposed below the cushion layer 400. The bottom chassis 500 may support the flat areas FA1 and FA2 of the display device 1 to maintain a flat state. In an embodiment, the bottom chassis 500 may be made of aluminum, stainless steel, or the like. The bottom chassis 500 may include a first portion 510 and a second portion 520 which are not connected to each other in the bending area BA of the display device 1 in order to fold the display device 1.

The buffer layer 30 is disposed below the panel assembly 10, and the bracket 20 is disposed below the buffer layer 30. The buffer layer 30 serves to alleviate and disperse an impact applied to the panel assembly 10 while attaching the panel assembly 10 to the bracket 20. The buffer layer 30 includes a first portion 31 having high rigidity, and a second portion 32 having low rigidity, to prevent or substantially prevent damage to the display pane 100 caused by an external impact, particularly a locally applied impact. The first portion 31 may be disposed to overlap with an edge of the panel assembly 10. The first portion 31 may overlap with the non-display area NA of the panel assembly 10. In an embodiment, a width of the first portion 31 may be greater than that of the non-display area NA. The second portion 32 may be disposed inside the first portion 31, and may be surrounded by the first portion 31. The second portion 32 may overlap with the display area DA of the panel assembly 10. The first portion 31 may serve or mainly serve to support the panel assembly 10, and the second portion 32 may serve or mainly serve as a buffer.

As such, when the buffer layer 30 is formed to include the first portion 31 that has high rigidity and overlaps with the edge of the panel assembly 10, and the second portion 32 that has low rigidity and is disposed inside the first portion 31, an impact applied locally to the panel assembly 10 and resulting deformation may be spread widely throughout the panel assembly 10 without being concentrated at a particular point (e.g., a point where a pen has fallen). As a result, tensile stress of the particular point to which the impact is applied may be reduced to prevent or substantially prevent damage, such as cracking at a specific point in the display panel 100.

The rigidity of the buffer layer 30 may be expressed by using an elastic modulus. For example, the first portion 31 of the buffer layer 30 may have an elastic modulus of about 500 MPa or more, and, in an embodiment, about 1000 MPa or more, to secure a sufficient supporting force. The second portion 32 of the buffer layer 30 may be advantageous in widely distributing deformation due to an external impact by a large difference in elastic modulus from the first portion 31, and may have an elastic modulus of about 10 MPa or less, and, in an embodiment, about 5 MPa or less. In an embodiment, the first portion 31 may be made of a polymer film or a metal layer having an elastic modulus that is similar to or greater than that of a polyimide film. In an embodiment, the second portion 32 may be a cushion layer made of a resin, such as polyurethane foam or acryl foam. In an embodiment, the first portion 31 may have a thickness of about 35 µm to about 200 µm, and, in an embodiment, about 50 µm to about 150 µm, and the second portion 32 may have the same or approximately the same thickness as the first portion 31. An increased thickness of the buffer layer 30 may be advantageous for improving impact resistance, but may increase the thickness of the display device 1. The first portion 31 and the second portion 32 may be spaced apart, or may contact each other.

The buffer layer 30 may be self-adhesive or may include an adhesive layer including, for example, a PSA so as to attach the panel assembly 10 to the bracket 20. The bottom chassis 500 may be attached to the bracket 20 by the buffer layer 30, and, thus, a top surface of the buffer layer 30 may be in contact with the bottom chassis 500, and a bottom surface of the buffer layer 30 may be in contact with the bracket 20.

The bracket 20 serves to secure the panel assembly 10. The bottom chassis 20 may include a first portion 21 and a second portion 22 which are not connected to each other in the bending area BA of the display device 1 in order to fold the display device 1. In an embodiment, the first portion 21 and the second portion 22 may be connected by a fastening member, such as a hinge. In an embodiment, the display device 1 may further include a back cover covering the bracket 20 and exposed to the outside of the display device 1, and the bracket 20 itself may be the back cover.

Figure 5:
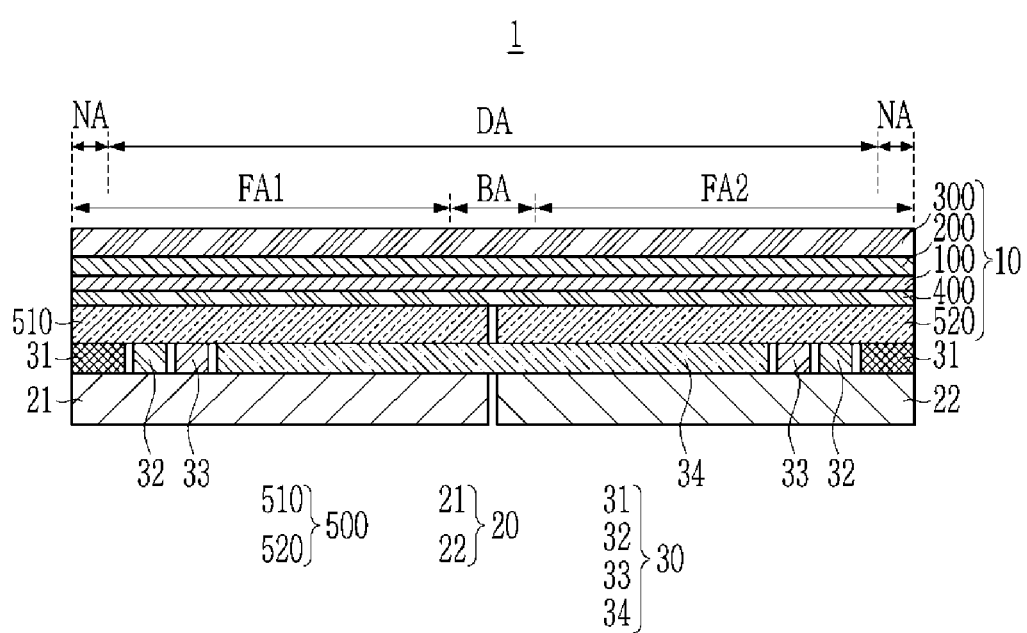
FIG. 5 is a cross-sectional view taken along the line III-III' of FIG. 1, according to an exemplary embodiment.
Figure 6:
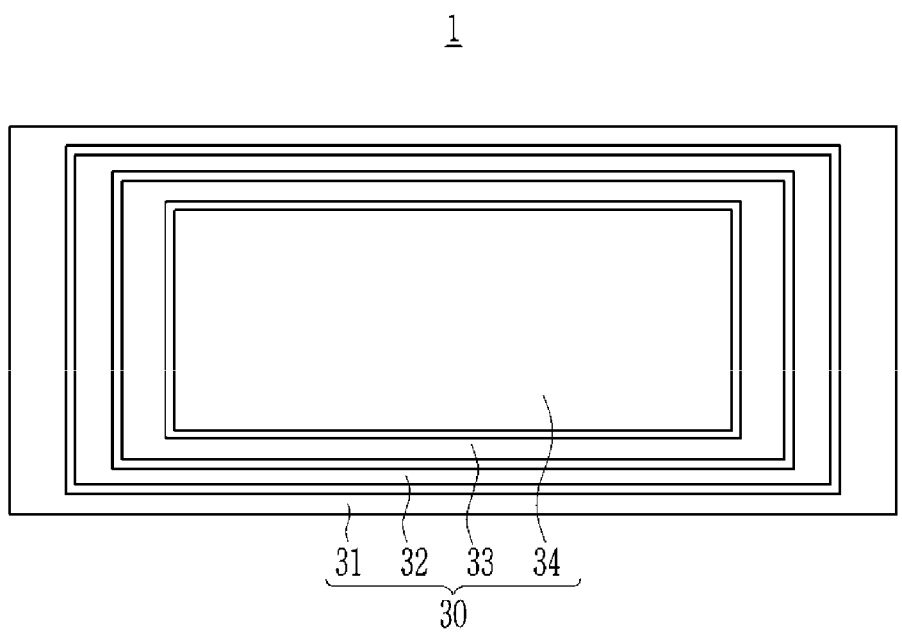
FIG. 6 is a bottom view illustrating the display device illustrated in FIG. 5 from which a bracket is omitted.

FIG. 5 is a cross-sectional view taken along the line III-III' of FIG. 1, according to an exemplary embodiment; and FIG. 6 is a bottom view illustrating the display device illustrated in FIG. 5 from which the bracket 20 is omitted.

The exemplary embodiment of FIG. 5 and FIG. 6 is different from the aforementioned exemplary embodiment in the buffer layer 30, and the remaining constituent elements of the display device may be the same. Therefore, the buffer layer 30 will be mainly described.

Referring to FIG. 5 and FIG. 6, according to an embodiment, the buffer layer 30 includes four portions, including a first portion 31, a second portion 32, a third portion 33, and a fourth portion 34. The rigidity of the first portion 31 disposed at an outermost side is the greatest, and the rigidity gradually decreases in the direction of the inner portions 32, 33, and 34. The elastic modulus of the first portion 31 is the greatest, the second portion 32 surrounded by the first portion 31 has an elastic modulus that is less than that of the first portion 31, the elastic modulus of the third portion 33 surrounded by the second portion 32 is less than that of the second portion 32, and the fourth portion 34 surrounded by the third portion 33 has an elastic modulus that is less than that of the third portion 33.

The first portion 31 may overlap with the edge of the panel assembly 10, and may overlap with the non-display area NA of the panel assembly 10. The second portion 32, the third portion 33, and the fourth portion 34 may overlap with the display area DA of the panel assembly 10. The first portion 31 may serve or mainly serve to support the panel assembly 10, and the second portion 32, the third portion 33, and the fourth portion 34 may serve or mainly serve as buffers. Therefore, in an embodiment, an elastic modulus difference between the first portion 31 and the second portion 32 may be greater than elastic modulus differences between the second, third, and fourth portions 32, 33, and 34. For example, the first portion 31 may have an elastic modulus that is about 500 MPa or more, and, in an embodiment, about 1000 MPa or more, and the second portion 32, the third portion 33, and the fourth portion 34 may have elastic moduli of about 50 MPa or less, and, in an embodiment, about 20 MPa or less, and, in an embodiment, about 10 MPa or less, and, in an embodiment, about 5 MPa or less.

When the thickness of the first portion 31 is decreased, a shock resistance effect may be reduced, particularly at a center portion of the panel assembly 10. When the thickness of the buffer layer 30 depending on the thickness of the first portion 31 is small, a distance between the panel assembly 10 and the bracket 20 is reduced, and, accordingly, as the buffer layer 30 contracts, a margin for absorbing and dispersing an impact is reduced. Accordingly, when an external impact is applied to the central portion of the panel assembly 10, the panel assembly 10 and the bracket 20 may substantially contact each other beyond a buffering capacity of a low-rigidity portion (e.g., the second portion 32 in the exemplary embodiment shown in FIG. 3 and FIG. 4) of the buffer layer 30 in a region to which the impact is applied. As a result, the impact propagating to a specific point of the display pane 100 may be increased as if it were chopped. As in the present exemplary embodiment, when an inner region of the first portion 31 is formed as parts having rigidity that is sequentially reduced toward the central portion of the panel assembly 10 instead of one part having the same rigidity, collapse of the fourth portion 34 at an innermost side may be supported by the second and third portions 32 and 33 at an outer side thereof. Therefore, it is possible to compensate for the buffer capacity reduction of the buffer layer 30 caused by the reduction of the thickness of the first portion 31.

The structure in which the buffer layer 30 includes two portions 31 and 32 having different rigidities has been described as an example according to the exemplary embodiment of FIG. 3 and FIG. 4, and the structure in which the buffer layer 30 includes four portions including different rigidities has been described as an example according to the exemplary embodiment of FIG. 5 and FIG. 6. However, the buffer layer 30 may include a plurality of portions that are lower in stiffness toward the central portion of the panel assembly 10, in addition to the structures including two or four portions.

Figure 7:
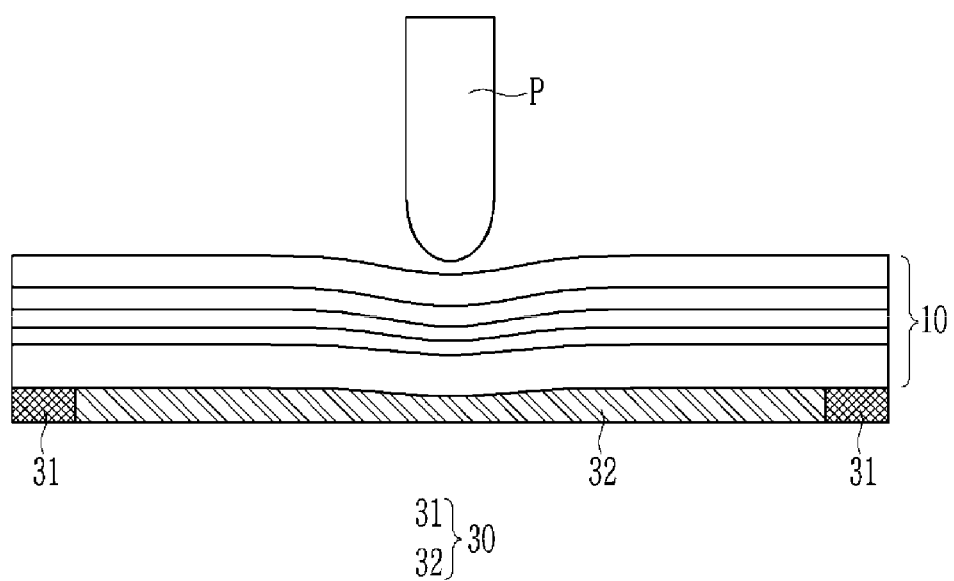
FIG. 7 illustrates a change in pen drop in a display device according to an exemplary embodiment.
Figure 8:
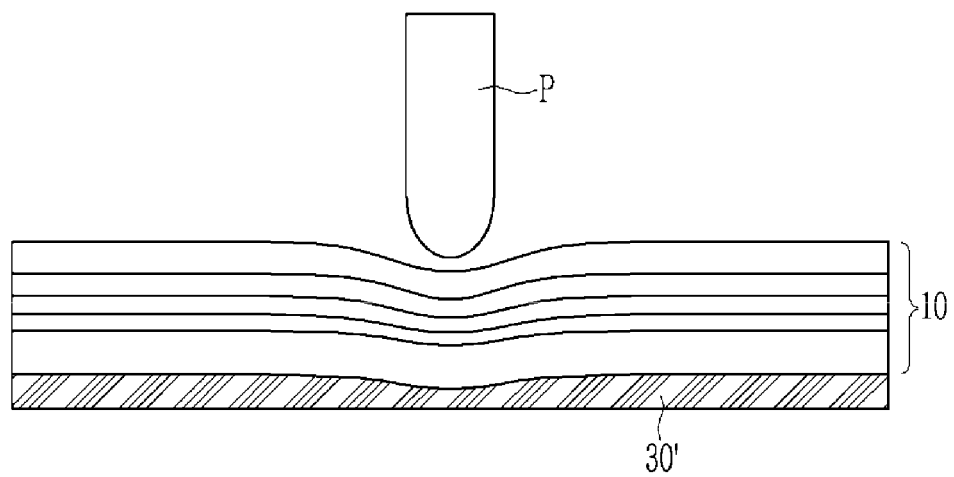
FIG. 8 illustrates a change in pen drop in a display device according to a comparative example.

FIG. 7 illustrates a change in pen drop in a display device according to an exemplary embodiment; and FIG. 8 illustrates a change in pen drop in a display device according to a comparative example.

Referring to FIG. 7 and FIG. 8, the panel assembly 10 may be deformed at the moment when a pen drops at the central portion thereof. In the exemplary embodiment of FIG. 7, the buffer layer 30 is disposed below the panel assembly 10, and, in this case, the buffer layer includes the first portion 31 of a polyimide film having high rigidity along a frame of the panel assembly 10 and the second portion 32 of a foam resin layer having low rigidity inside the first portion 31. In the comparative example of FIG. 8, an adhesive such as a PSA is disposed on an entire surface of the panel assembly 10 as a buffer layer 30' below the panel assembly 10. The deformation of the region where the pen P drops is smaller in the exemplary embodiment than in the comparative example. This is because the impact applied to the panel assembly 10 by the pen P tends to concentrate at a point where the pen P drops in the comparative example, while the impact may be widely dispersed throughout the panel assembly 10 due to the difference in rigidity between the first portion 31 and the second portion 32. Since the tensile stress at the point where the pen P drops is reduced in the exemplary embodiment as compared with the comparative example, the possibility of damage such as cracks, short circuits, disconnection, and the like in the display panel of the panel assembly 10 is reduced.

Table 1 shows results of a drop test using a pen and a DuPont impact tester according to the exemplary embodiment and the comparative example. In a test according to the comparative example, when a pen dropped at a height of 5 cm, bright spot defectiveness occurred on the display panel. In a test according to the exemplary embodiment, when a pen was dropped from a height of 8 cm, a bright spot defect occurred on the display panel. In addition, in a test according to the comparative example, when a weight was dropped from a height of 4 cm, a bright spot defect occurred on the display panel. In a test according to the exemplary embodiment, when a weight was dropped at a height of 16 cm, a bright spot defect occurred on the display panel. It is seen that the impact resistance of the display device is significantly improved in the exemplary embodiment as compared with the comparative example.

TABLE 1

| | Test according to exemplary embodiment | Test according to comparative example |
|---|---|---|
| Pen drop | 8 cm bright spot defect | 5 cm bright spot defect |
| DuPont impact tester | 16 cm bright spot defect | 4 cm bright spot defect |

Figure 9:
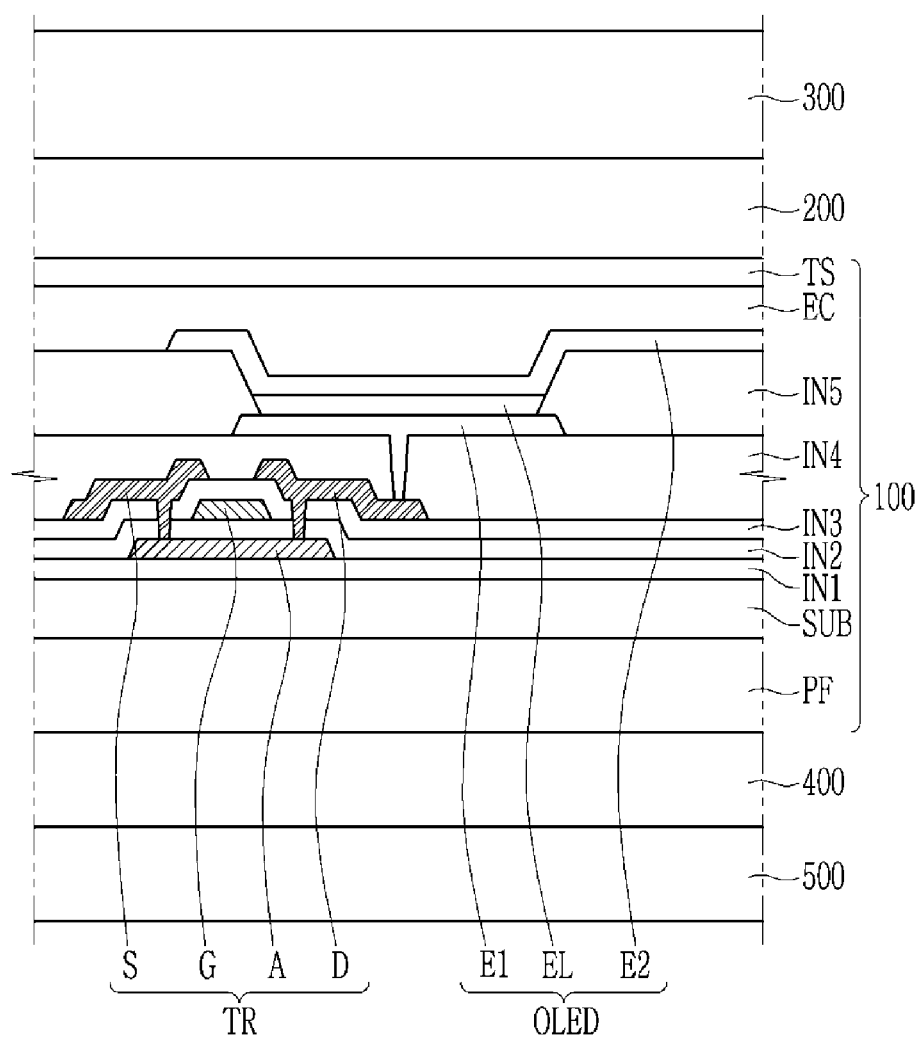
FIG. 9 illustrates a cross-sectional view of a panel assembly according to an exemplary embodiment.

Herein, a cross-sectional structure of the panel assembly 10 according to an embodiment will be described in further detail with reference to FIG. 9. FIG. 9 is a cross-sectional view illustrating an example of a stacked structure of the panel assembly 10 according to an exemplary embodiment. A cross-section illustrated in FIG. 9 may substantially correspond to one pixel area.

The panel assembly 10 includes a display panel 100, and the display panel 100 basically includes a substrate SUB, a transistor TR formed on the substrate SUB, and an organic light emitting diode OLED connected to the transistor TR.

The substrate SUB may be a flexible substrate made of a polymer, such as polyimide (PI), polyamide (PA), or polyethylene terephthalate (PET). The substrate SUB may include a barrier layer for preventing or substantially preventing moisture, oxygen, etc. from penetrating from the outside. For example, the substrate SUB may include one or more polymer layers and one or more barrier layers, and the polymer layers and the barrier layers may be alternately stacked.

A first insulating layer IN1 is disposed on the substrate SUB. The first insulating layer IN1 may be referred to as a buffer layer, and may serve to block impurities that may diffuse from the substrate SUB to a semiconductor layer A and reduce stress applied to the substrate SUB in a process of forming the semiconductor layer A. In an embodiment, the barrier layer and the first insulating layer IN1 may include an inorganic insulating material, such as a silicon oxide, a silicon nitride, or the like.

The semiconductor layer A of the transistor TR is disposed on the first insulating layer IN1, and a second insulating layer IN2 is disposed on the semiconductor layer A. The semiconductor layer A includes a source region and a drain region, and a channel region between these regions. The semiconductor layer A may include a semiconductor material, such as any of polysilicon, an oxide semiconductor, and amorphous silicon. The second insulating layer IN2 may be referred to as a gate insulating layer, and may include an inorganic insulating material.

A gate conductor including a gate electrode G of the transistor TR is disposed on the second insulating layer IN2. The gate conductor may include a metal, such as molybdenum (Mo), copper (Cu), aluminum (Al), silver (Ag), chromium (Cr), tantalum (Ta), or titanium (Ti), or a metal alloy thereof.

A third insulating layer IN3 is disposed on the substrate SUB. The third insulating layer IN3 may be referred to as a gate insulating layer, and may include an inorganic insulating material.

A data conductor including a source electrode S and a drain electrode D of the transistor TR is disposed on the third insulating layer IN3. The source electrode S and the drain electrode D are respectively connected to the source region and the drain electrode of the semiconductor layer A through contact holes formed in the third insulating layer IN3 and the second insulating layer IN2. The data conductor is made of a metal, such as aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni), or a metal alloy thereof.

A fourth insulating layer IN4 is disposed on the data conductor. The fourth insulating layer IN4 may be referred to as a planarization layer, and may include an organic insulating material.

A first electrode E1 is disposed on the fourth insulating layer IN4. The first electrode E1 may be referred to as a pixel electrode. The first electrode E1 is connected to the drain electrode D through a contact hole formed in the fourth insulating layer IN4 to receive a data signal for controlling the luminance of the organic light emitting diode OLED.

A fifth insulating layer IN5 is disposed on the fourth insulating layer IN4. The fifth insulating layer IN5 may be referred to as a pixel definition layer, and may have an opening that overlaps the first electrode E1. In the opening of the fifth insulating layer IN5, an emission layer EL is disposed on the first electrode E1, and a second electrode E2 is disposed on the emission layer EL. The second electrode E2 may be referred to as a common electrode (CE).

The first electrode E1, the emission layer EL, and the second electrode E2 together constitute an organic light emitting diode OLED. In an embodiment, the first electrode E1 may be an anode of an organic light emitting diode OLED, and the second electrode E2 may be a cathode of an organic light emitting diode OLED.

An encapsulation layer EC is disposed on the second electrode E2. The encapsulation layer EC encapsulates an organic light emitting diode OLED to prevent or substantially prevent moisture or oxygen from penetrating from the outside. The encapsulation layer EC may include at least one inorganic material layer and at least one organic material layer, and inorganic material layers and organic material layers may be alternately stacked.

A touch sensor layer TS may be disposed on the encapsulation layer EC. The touch sensor layer TS may include touch electrodes made of a transparent conductive material such as ITO or IZO, a metal mesh, or the like, and the touch electrodes may be formed as a single layer or a multi-layer. The touch sensor layer TS may be formed directly on the encapsulation layer EC, or may be separately formed and attached to the encapsulation layer EC.

An anti-reflective layer 200 for reducing external light reflection may be disposed on the touch sensor layer TS. The anti-reflective layer 200 may include a polarization layer. In an embodiment, the anti-reflection effect may be obtained by forming the sealing layer EC or the touch sensor layer TS in a refractive index matching structure without forming the anti-reflection layer 200 separately.

A cover window 300 for protecting the display pane 100 may be disposed on the anti-reflection layer 200.

A protective layer PF for protecting the display pane 100 may be disposed below the substrate SUB, and a cushion layer 400 may be disposed below the protective layer PF. In addition to the cushion layer 400, a functional sheet, such as a light-blocking sheet, a heat-generating sheet, or a water-proof tape, may be further disposed below the protective layer PF. A bottom chassis 500 supporting the display pane 100 may be disposed below the cushion layer 400.

Although an organic light emitting diode display panel has been described as an example of the display panel 100, the display panel may include, for example, a display panel including a light emitting diode (LED), a display panel including a liquid crystal layer, or the like.

While the present invention has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a display panel comprising at least one bending area;
   a bracket disposed below the display panel and comprising a first part and a second part connected by a hinge overlapping the bending area in a plan view;
   a first rigidity portion disposed between the display panel and the bracket and overlapping an outer area of the display panel in a plan view; and
   a second rigidity portion disposed between the display panel and the bracket, overlapping an inner area of the display panel in a plan view, overlapping the first rigidity portion in a direction perpendicular to a thickness direction of the display device in a cross-sectional view, and having a rigidity different from that of the first rigidity portion.

2. The display device of claim 1, further comprising:
   a metal plate disposed between the display panel and the first and second rigidity portions and including at least one opening overlapping the bending area in a plan view.

3. The display device of claim 2, wherein the first rigidity portion connects the metal plate and the bracket.

4. The display device of claim 2, wherein the second rigidity portion is interposed between the metal plate and the bracket.

5. The display device of claim 1, wherein the first rigidity portion comprises a polymer or a metal.

6. The display device of claim 1, wherein the second rigidity portion comprises a foam resin.

7. The display device of claim 1, wherein the first rigidity portion has an elastic modulus greater than that of the second rigidity portion.

8. The display device of claim 7, wherein the first rigidity portion has an elastic modulus of 500 MPa or more, and the second rigidity portion has an elastic modulus of 10 MPa or less.

9. The display device of claim 7, wherein the first rigidity portion has an elastic modulus of 1000 MPa or more, and the second rigidity portion has an elastic modulus of 5 MPa or less.

10. The display device of claim 1, wherein the second rigidity portion is at least partially surrounded by the first rigidity portion.

11. The display device of claim 1, wherein the second rigidity portion is spaced apart from the first rigidity portion.

12. The display device of claim 2, wherein at least a part of the first rigidity portion and at least a part of the second rigidity portion are disposed at a same distance from the metal plate.

13. The display device of claim 1, wherein the first rigidity portion is located along an edge of the display panel.

14. The display device of claim 1, wherein
the display panel further comprises a display area to display an image, and a non-display area around the display area, and
the first rigidity portion overlaps the non-display area in a plan view.

15. The display device of claim 14, wherein the second rigidity portion overlaps the display area in a plan view.

16. The display device of claim 1, wherein the first rigidity portion is an adhesive layer including a pressure sensitive adhesive.

17. The display device of claim 16, wherein the second rigidity portion is an adhesive layer including a pressure sensitive adhesive.

* * * * *